United States Patent
Ring et al.

(10) Patent No.: US 7,582,909 B2
(45) Date of Patent: Sep. 1, 2009

(54) MOUNTING AND ADHESIVE LAYER FOR SEMICONDUCTOR COMPONENTS

(75) Inventors: Melanie Ring, Munich (DE); Benjamin Prodinger, Wernberg (AT); Werner Kuhlmann, Munich (DE)

(73) Assignee: Infineon Technologies AG, Munich (DE)

( * ) Notice: Subject to any disclaimer, the term of this patent is extended or adjusted under 35 U.S.C. 154(b) by 232 days.

(21) Appl. No.: 11/450,902

(22) Filed: Jun. 9, 2006

(65) Prior Publication Data

US 2006/0292717 A1 Dec. 28, 2006

Related U.S. Application Data

(63) Continuation of application No. PCT/DE2004/02701, filed on Dec. 8, 2004.

(30) Foreign Application Priority Data

Dec. 9, 2003 (DE) ................... 103 57 673

(51) Int. Cl.
*H01L 27/15* (2006.01)
*H01L 31/12* (2006.01)
*H01L 33/00* (2006.01)

(52) U.S. Cl. .................. 257/81; 257/E23.019; 257/99; 257/431; 257/784; 438/21

(58) Field of Classification Search .................. 257/751, 257/764, 79–81, 431, 99, 753, 781–784, 257/E21.506, E23.008, E23.019, E25.02, 257/763, 80, 77, 694, 702; 438/21

See application file for complete search history.

(56) References Cited

U.S. PATENT DOCUMENTS

| | | | | |
|---|---|---|---|---|
| 5,008,735 A | * | 4/1991 | Edmond et al. | 257/77 |
| 6,339,257 B1 | * | 1/2002 | Fujiki et al. | 257/751 |
| 7,064,176 B2 | | 6/2006 | Halik et al. | |
| 2002/0084516 A1 | * | 7/2002 | Efland et al. | 257/666 |
| 2003/0160259 A1 | * | 8/2003 | Uemura | 257/99 |
| 2003/0178627 A1 | * | 9/2003 | Marchl et al. | 257/80 |

FOREIGN PATENT DOCUMENTS

| | | |
|---|---|---|
| DE | 199 25 960 A1 | 1/2001 |
| DE | 101 15 882 A1 | 12/2002 |

* cited by examiner

*Primary Examiner*—Chris C Chu
(74) *Attorney, Agent, or Firm*—Slater & Matsil, L.L.P.

(57) ABSTRACT

An assembly and adhesive layer for semiconductor components is arranged between a silicon support (submount) and an electronic functional element for the formation of an electrically-conducting connection between the silicon support and the functional element. The assembly and adhesive layer are arranged on the support. The assembly and adhesive layer are made from a Ti/TiN layer (6), applied to an aluminum contact surface (5) of the silicon support (1), by means of a deposition method. The aluminum contact surface (5) is located on a landing pad (2) on the silicon support (1).

13 Claims, 1 Drawing Sheet

MOUNTING AND ADHESIVE LAYER FOR SEMICONDUCTOR COMPONENTS

This application is a continuation of co-pending International Application No. PCT/DE2004/002701, filed Dec. 8, 2004, which designated the United States and was not published in English, and which is based on German Application No. 103 57 673.8 filed Dec. 9, 2003, both of which applications are incorporated herein by reference.

TECHNICAL FIELD

The invention relates to a mounting and adhesive layer for semiconductor components between a silicon carrier and an electronic functional element for forming an electrically conducting connection between the silicon carrier and the functional element.

BACKGROUND

In addition to conventional soldering using a lead-containing solder, electrically conductive adhesive bonding is increasingly being used to produce electrical connections between silicon components and carrier elements in the field of microelectronics. The main reason for this is the ban of the use of lead for soldering purposes decreed by the European Union. For this reason, it is necessary to use lead-free solders to produce electrical connections. However, the drawback of lead-free solders lies in the considerably higher melting temperature (170-185° C.).

For applications that require a low-heat joining process at temperatures up to at most approx. 85° C., electrically conductive adhesive bonding is the preferred connection technology.

In one specific example, an LED (light emitting diode) is to be mounted on a silicon carrier (submount). This requires the LED to be mounted on the surface of the silicon carrier and, at the same time, to be electrically contact-connected. To achieve this, the rear side contact of the LED has to be connected to the submount surface via a conducting connection. The second contact required is then contact-connected to the submount surface from the top side of the LED via a bonding wire. This connection can be produced with the aid of standard wire bonding techniques. For this purpose, aluminum contact surfaces are usually provided on the submount in order to allow contact-connection of the bonding wire, which may consist of aluminum.

However, on account of the inevitable formation of an oxide layer on the metal surface, the metallization (Al) used here is not suitable for electrically conductive adhesive bonding. The oxide layer (insulator), which is present on the metal surface, is formed in the case of components that are not hermetically packaged unless measures are taken to avoid this. This oxide layer forms because the epoxy resin adhesive that is customarily used is relatively pervious to moisture.

In order nevertheless to be able to realize an electrically conductive connection, an adhesive and conductive connection is required on what is known as the chip land surface.

Precious metals, such as silver, platinum, palladium, etc., have proven to be materials that can be used for this purpose, since they scarcely form an oxide layer or, in the case of silver, form a conducting oxide layer. However, on account of the electrochemical series, in conjunction with catalysts (e.g., moisture), aluminum pitting (corrosion) can occur.

Another possible option is to use ITO (indium tin oxide). A layer of this material is frequently used in semiconductor fabrication and in LCDs (liquid crystal displays) since it is both transparent and conductive. Therefore, this layer can be used as a light-transmitting electrode for LEDs (light emitting diodes) and also for LCDs. It can also be used as an opaque screening means, for example, above the photodiode of an optocoupler in order to increase the common-mode rejection or in very general terms to improve the sensitivity to interfering electromagnetic radiation.

If an ITO layer of this type is to be bonded to a standard aluminum metallization, the problem arises that the oxygen of the ITO layer oxidizes the uppermost Al layer, with the result that the inherently conductive connection is interrupted. To avoid this, a precious metal is recommended as an interface, in which context platinum can be used together with Ti or Cr as an adhesion promoter.

There are usually two ways of realizing a bondable and adhesive metallization. The first known way is a base metallization for bonding (e.g., Al) and a further precious metal metallization or a metal that is less prone to oxidation (e.g., TiPt), which is applied only in the region of the adhesive surface. The second way consists in a precious metal metallization, which is both adhesive and bondable (e.g., TiPtAu).

The first way has the drawback that corrosion can occur between the two metallizations via the intervention of a catalyst. The second way has the particular disadvantage that on account of the extremely low surface roughness of Au, bonding problems can occur with further layers or, for example, with potting resins. Furthermore, TiPtAu is available in very few silicon lines, and, consequently, additional investment costs would be incurred, whereas Al is a standard metallization for silicon.

SUMMARY OF THE INVENTION

The invention is now based on the object of providing a mounting and adhesive layer for semiconductor components for producing electrical connections to carrier elements, which can be produced in a particularly simple way and reliably avoids the build-up of electrochemical stresses.

The object on which the invention is based is achieved by virtue of the fact that the mounting and adhesive layer includes a Ti/Ti-nitride layer and is applied by a deposition process to an aluminum contact surface of the silicon carrier, the aluminum contact surface being located on a landing pad of the silicon carrier.

The Ti/Ti-nitride layer may in this case be applied to the entire contact surface of the carrier or at least to the landing pad.

Standard deposition processes, such as PCVD processes or sputtering, are suitable for the deposition of the Ti/TiN layer.

Particular advantages of using Ti/TiN as a mounting and adhesive surface are the known process and deposition properties in semiconductor fabrication. A further advantage is that a build-up of electrochemical stresses, as may occur with different metallizations, leading to corrosion, is avoided. Furthermore, the Ti/TiN layer has good adhesive properties, a suitable surface condition and a low contact resistance with respect to other metals, and also bonds well to oxides and nitrides. Furthermore, titanium nitride is available as a standard material in CMOS fabrication, where it is often used as a diffusion barrier between silicon and aluminum.

DESCRIPTION OF THE DRAWINGS

The invention is to be explained in more detail below on the basis of an exemplary embodiment. In the associated drawings.

Figure 1:
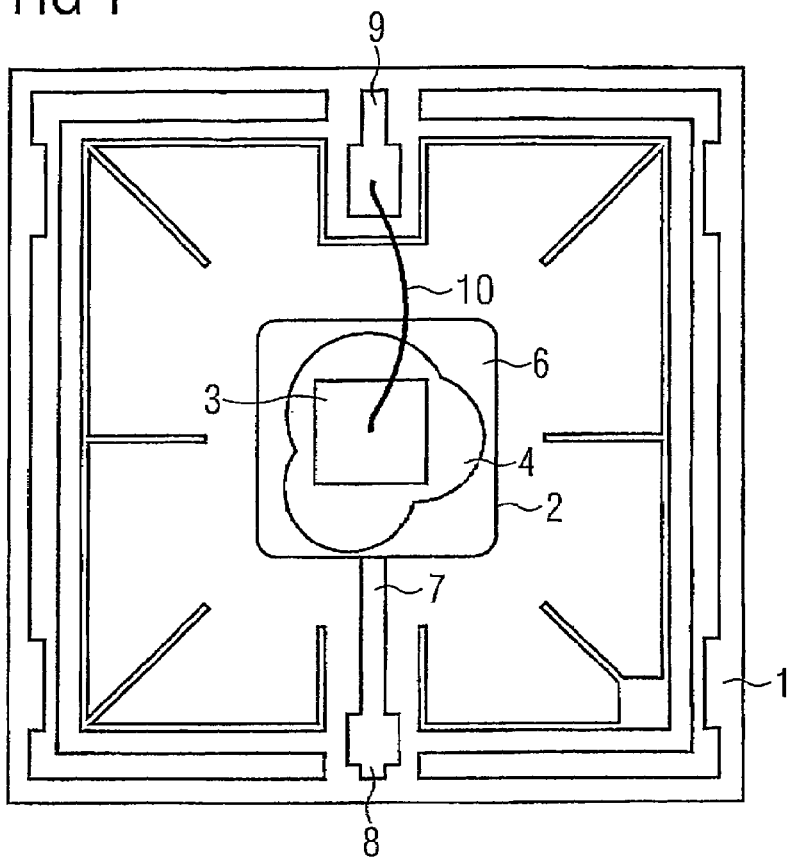
FIG. 1 diagrammatically depicts a LED mounted on a silicon carrier.

The following list of reference symbols can be used in conjunction with the figures:
1. Silicon carrier
2. Landing pad
3. LED
4. Conductive adhesive
5. Aluminum contact surface
6. Ti/Ti-nitride layer
7. Interconnect
8. Contact pad
9. Contact pad
10. Bonding wire
11. Front side contact

DETAILED DESCRIPTION OF ILLUSTRATIVE EMBODIMENTS

Figure 2:
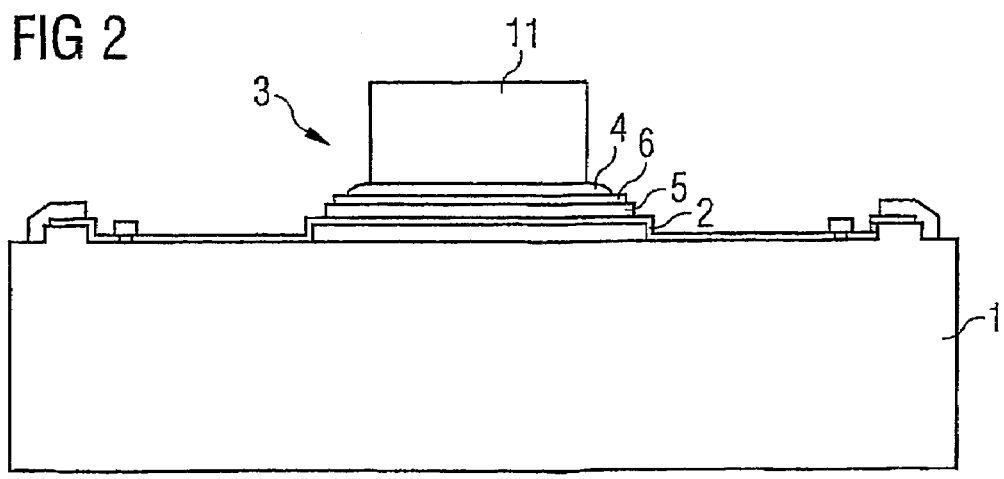
FIG. 2 shows a side view of the arrangement from FIG. 1.

FIGS. 1 and 2 show a silicon carrier 1 (submount) with a central landing pad 2 made from silicon, on which an LED 3 has been mounted via a conductive adhesive bond with the aid of a conductive adhesive 4.

An aluminum contact surface 5 has been applied to the landing pad 2, for example by means of a PVD process, to produce the electrical contact between the landing pad 2 and the rear side electrode (not shown) of the LED 3. Since aluminum, as has already been explained, under appropriate ambient conditions, forms a non-conducting aluminum oxide layer on the surface, a Ti/Ti-nitride layer 6 is deposited immediately after the deposition of Al.

The Ti/TiN layer 6 reliably protects the aluminum contact surface 5 from oxidation, so that a permanently low contact resistance of the contact between the rear side electrode of the LED 3 and the landing pad 2 on the silicon carrier 1, comprising the aluminum contact surface 5, the Ti/TiN layer 6 and the conductive adhesive 4, is ensured.

To allow the arrangement described to be electrically connected to other modules, the landing pad 2 is connected to a contact pad 8 via an interconnect 7. Finally, there is also a further contact pad 9, which is connected to the front side contact 11 of the LED 3 via a bonding wire 10 (wire bridge).

It will be understood that this embodiment constitutes just one example of numerous possible embodiments of the invention.

What is claimed is:

1. A conductive adhesive connection between a silicon carrier and an electronic functional element, said connection for adhesively mounting and forming an electrically conducting connection between the silicon carrier and the functional element, the conductive adhesive connection comprising:

an oxidation free aluminum contact surface on the silicon carrier;

a Ti/Ti-nitride layer applied by a deposition process to and in contact with the oxidation free aluminum contact surface, the aluminum contact surface being located on a landing pad of the silicon carrier, said landing pad being separate and distinct from said oxidation free aluminum contact surface; and a conductive adhesive between and in contact with both the Ti/Ti-nitride layer and the functional element.

2. The conductive adhesive connection as claimed in claim 1, wherein said aluminum contact surface has a selected area and the Ti/Ti-nitride layer is applied to all of said selected area of said aluminum contact surface of the silicon carrier.

3. The conductive adhesive connection as claimed in claim 1, wherein the Ti/Ti-nitride layer is applied at least to the landing pad.

4. The conductive adhesive connection as claimed in claim 1, wherein the Ti/Ti-nitride layer is applied by a PCVD process.

5. The conductive adhesive connection as claimed in claim 1, wherein the Ti/Ti-nitride layer is applied by sputtering.

6. An electrical component comprising:

a carrier having a first contact and a second contact;

a landing pad having an oxidation free aluminum contact surface electrically connected to the first contact, said landing pad being separated and distinct from said aluminum contact surface;

a Ti/TiN layer overlying and in contact with the aluminum contact surface that is connected to the first contact;

a conductive adhesive layer disposed on and in contact with said Ti/TiN layer; and an electronic functional element comprising a first electrode and a second electrode, wherein the first electrode is in direct physical contact with and electrically connected to the Ti/TiN layer and mechanically connected to the carrier by said electrically conductive adhesive layer and wherein the second electrode is wire bonded to the second contact.

7. The electrical component according to claim 6, wherein the electronic functional element comprises a light emitting diode (LED).

8. The electrical component according to claim 7, wherein the first electrode is disposed on a first surface of the LED and the second electrode is disposed on a second surface of the LED, the first surface opposed from the second surface.

9. The electrical component according to claim 6, wherein the aluminum contact surface comprises a pure aluminum.

10. The electrical component according to claim 6, wherein Ti is in direct contact with the aluminum contact surface and TiN is in direct contact with the electrically conductive adhesive layer.

11. The electrical component according to claim 6, wherein the carrier comprises a silicon carrier.

12. The electrical component according to claim 6, wherein the Ti/TiN layer overlies an entire surface of the aluminum contact surface.

13. The electrical component according to claim 6, wherein the Ti/TiN layer overlies only a portion of the aluminum contact surface.

* * * * *